US006653750B2

(12) United States Patent
Komiya

(10) Patent No.: US 6,653,750 B2
(45) **Date of Patent: *Nov. 25, 2003**

(54) ELECTROLUMINESCENCE DISPLAY APPARATUS FOR DISPLAYING GRAY SCALES

(75) Inventor: Naoaki Komiya, Ogaki (JP)

(73) Assignee: Sanyo Electric Co., Ltd. (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/448,580

(22) Filed: Nov. 23, 1999

(65) Prior Publication Data

US 2003/0020335 A1 Jan. 30, 2003

(30) Foreign Application Priority Data

Nov. 27, 1998 (JP) .......................................... 10-337841

(51) Int. Cl.$^{7}$ ............................................... G11C 19/00

(52) U.S. Cl. .......................... 307/125; 345/92; 345/205

(58) Field of Search ....................... 307/125; 315/169.1, 315/169.3, 224, 167, 291; 345/76, 77, 82, 92, 204, 211, 212, 214, 209, 79, 205

(56) References Cited

U.S. PATENT DOCUMENTS 4,042,854 A * 8/1977 Luo et al. ................ 315/169.3
4,110,662 A * 8/1978 Greeneich et al. .......... 345/206
4,855,724 A * 8/1989 Tang ........................... 345/88
5,091,722 A * 2/1992 Kitajima et al. .............. 345/89
5,237,314 A * 8/1993 Knapp ......................... 345/84
5,400,050 A * 3/1995 Matsumoto et al. ........ 345/208
5,684,365 A * 11/1997 Tang et al. .............. 315/169.3
5,712,653 A * 1/1998 Katoh et al. ................ 345/100
5,828,429 A 10/1998 Takemura
5,844,538 A * 12/1998 Shiraki et al. ................ 345/98
5,999,150 A * 12/1999 Nighan et al. ................ 345/79
6,023,075 A * 2/2000 Yamazaki .................... 257/72
6,023,308 A 2/2000 Takemura
6,040,812 A * 3/2000 Lewis ........................ 345/691
6,104,041 A * 8/2000 Hsuch et al. ................. 257/59
6,147,451 A * 11/2000 Shibata et al. .............. 313/506
6,157,356 A * 12/2000 Troutman ................... 345/205
6,180,957 B1 * 1/2001 Miyasaka et al. ........... 257/336
6,194,837 B1 * 2/2001 Ozawa .................... 315/169.1
6,195,142 B1 * 2/2001 Gyotoku et al. ............ 315/504
6,204,610 B1 * 3/2001 Komiya ................... 315/169.3
6,246,180 B1 * 6/2001 Nishigaki ................ 315/169.3
6,265,889 B1 * 7/2001 Tomita et al. .............. 324/765
6,306,213 B1 * 10/2001 Yamazaki .................... 117/95
6,307,322 B1 * 10/2001 Dawson et al. .......... 315/169.1
6,317,121 B1 * 11/2001 An ............................ 345/211
6,337,235 B1 * 1/2002 Miyanaga et al. ........... 134/1.2
6,462,722 B1 * 10/2002 Kimura et al. ................ 345/76
6,501,448 B1 * 12/2002 Komiya et al. ............... 345/80
6,509,692 B2 * 1/2003 Komiya ................... 315/169.3
6,556,176 B1 * 4/2003 Okuyama et al. ............. 345/76
2001/0022573 A1 * 9/2001 Sasaki et al. ............... 345/100
2002/0057244 A1 * 5/2002 Koyama et al. .............. 345/87
2003/0034940 A1 * 2/2003 Yamazaki et al. ............ 345/82

* cited by examiner

*Primary Examiner*—Gregory J. Toatley, Jr.
*Assistant Examiner*—Roberto J. Rios
(74) *Attorney, Agent, or Firm*—Cantor Colburn LLP

(57) ABSTRACT

The emitted luminance of an EL device is controlled in an analog manner so as to realize a multiple gray-scale display by employing a first TFT (101) for switching, which turns on and off according to a selection signal SCAN1, and a second TFT (104) for driving an EL device (103) having an emissive layer between a pair of electrodes, by providing an analog switch (31) for sampling an analog video signal (VIDEO) at a predetermined period and a capacitor (102) for holding a sampling voltage from the analog switch (31), and by applying the analog voltage held in the capacitor (102) to the gate of the second TFT.

12 Claims, 3 Drawing Sheets

ELECTROLUMINESCENCE DISPLAY APPARATUS FOR DISPLAYING GRAY SCALES

BACKGROUND OF THE INVENTION

1. Field of the Invention

The present invention relates to an active-matrix display apparatus in which an organic electroluminescence (EL) device is driven using a thin-film transistor (TFT).

2. Description of the Related Art

Organic EL devices are ideal for thin configurations as they emit light and do not require the backlight that is required in liquid crystal displays, and they also do not have restrictions in viewing angle. Thus, the application of organic EL devices is highly expected in the next generation of display devices.

Organic EL display apparatuses can be divided into two types by their structure for selecting and driving the individual organic EL devices; a passive type having a simple matrix structure and an active-matrix type using TFTs. In the active-matrix type, a drive circuit shown in FIG. 1 will be used for each pixel.

In FIG. 1 is shown an organic EL device 3. A drive circuit for one pixel comprises a first TFT 1 for switching, which has a display signal Data1 applied to its drain and which turns on and off by a selection signal SCAN1, a capacitor 2, which is charged by the display signal Data1 that is supplied when the TFT 1 is on and holds a charging voltage Vh1 when the TFT 1 is off, and a second TFT 4, which has its drain connected to a common driving supply COM, its source connected to the anode of the organic EL device 3, and its gate supplied with the holding voltage Vh1 from the capacitor 2 so that the organic EL device 3 is driven with power from the common driving supply COM.

The selection signal SCAN1 then becomes a high level signal during a selected one horizontal scan period (1H) as shown in FIG. 2(*a*), and the display signal Data1, as shown in FIG. 2(*b*), is a pulse width modulation signal having a constant pulse amplitude and a pulse width dependent on the emitted luminance to be displayed.

Thus, when the SCAN1 signal goes to a high level and the TFT 1 turns on, the display signal Data1 is supplied to one end of the capacitor 2 via the TFT 1, and the voltage Vh1, which is proportional to the pulse width of the display signal Data1, charges the capacitor 2 as shown in FIG. 2(*c*). The voltage Vh1 is continuously held at the capacitor 2 during one vertical scan period (1V) even if the SCAN1 goes to a low level and the TFT 1 turns off. Since the voltage Vh1 is being supplied to the gate electrode of the TFT 4, the amount of current supplied to the organic EL device 3 via the TFT 4 is controlled in accordance with the voltage Vh1. As a result thereof, the EL device is controlled to emit light at a luminance proportional to the voltage Vh1. Namely, a gray-scale display is achieved by the pulse width of the display signal Data1.

Generally, the current I versus voltage V characteristic of the EL device has a non-linear relationship as shown in FIG. 3, and the emitted brightness (luminance) B versus voltage V characteristic also has a non-linear relationship as shown in FIG. 3. In particular, the active-matrix device is driven at a relatively low voltage range so that the linearity is worse than that shown in FIG. 3. Thus, $\gamma$ correction becomes necessary for the image signal to be displayed.

However, for the $\gamma$-corrected image signal, it is difficult to precisely express gray-scale levels using pulse widths, and as a result, it is difficult to implement a multiple gray-scale display in configurations of the related art.

SUMMARY OF THE INVENTION

It is therefore an object of the present invention to solve the above-mentioned shortcomings so as to easily and accurately perform gray-scale display operations.

In order to achieve this object, the present invention is characterized by an electroluminescence display apparatus performing display operations by driving an electroluminescence device having an emissive layer between a pair of electrodes, where the electroluminescence display apparatus comprises: a sampling circuit for sampling an analog video signal at a predetermined period; a capacitor for holding a sampling voltage proportional to the sampled analog video signal that is output from the sampling circuit; a first switch for switching, which is disposed between the sampling circuit and the capacitor and which turns on and off according to a selection signal, for supplying the sampling voltage from the sampling circuit to the capacitor; and a second switch for device driving, which is connected to the electroluminescence device, for the purpose of controlling the light emission at the device by supplying current to the electroluminescence device according to the sampling voltage held at the capacitor.

Another aspect of the present invention is characterized by an electroluminescence display apparatus performing display operations by driving the electroluminescence device having the emissive layer between a pair of electrodes, where the electroluminescence display apparatus comprises: a plurality of display signal lines along rows or columns, and a plurality of selection signal lines disposed so as to intersect with the display signal lines; a sampling circuit for sampling the analog video signal that is input and supplying the analog sampling voltage as a display signal to the corresponding line of the plurality of display signal lines; and a pixel formed near each intersection of the plurality of display signal lines and the plurality of selection signal lines; where the pixel comprises: the electroluminescence device for emitting light according to power supplied from a driving supply; a capacitor for holding the sampling voltage that is supplied as the display signal from the sampling circuit; a first thin-film transistor for switching, which is disposed between the sampling circuit and the capacitor and which turns on and off according to the selection signal that is received as a control signal, for supplying the sampling voltage from the sampling circuit to the capacitor; and the second thin-film transistor for device driving, which is connected to the electroluminescence device, for the purpose of causing the device to emit light by supplying current from the driving supply to the electroluminescence device according to the sampling voltage held at the capacitor.

In still another aspect of the present invention in the above-mentioned electroluminescence display apparatus, the sampling voltage that is sampled at the sampling circuit is a voltage proportional to a gray scale to be displayed.

In this manner, the sampling circuit samples the analog video signal as analog voltage data, and this sampled analog voltage data is held in the capacitor and drives the electroluminescence device. Namely, according to the present invention, analog gray-scale control is possible, and it is possible to accurately and easily perform multiple gray-scale display operations in an active-matrix electroluminescence display apparatus.

Furthermore, in another aspect of the present invention in the above-mentioned electroluminescence display apparatus, the first and second switches in the present invention are thin-film transistors which have their active layer formed from polycrystalline silicon.

If thin-film transistors employing polycrystalline silicon for the active layer are used, high-speed response is possible, and the channel region, source region, and drain region can be formed through self aligning so that the transistors can be formed in a small area. Thus, driving the electroluminescence device using this sort of thin-film transistor easily enables a high-resolution display apparatus to be realized.

Furthermore, in another aspect of the present invention in the above-mentioned electroluminescence display apparatus, the emissive layer of the electroluminescence device includes an organic compound with light emitting function.

In this manner, the electroluminescence device utilizing an organic compound for the emissive layer has a high degree of freedom in the color of emitted light and can realize a high emitted luminance. Thus, using this device in the display apparatus can yield a display apparatus having extremely superior luminescent characteristics.

DETAILED DESCRIPTION OF THE PREFERRED EMBODIMENTS

Figure 1:
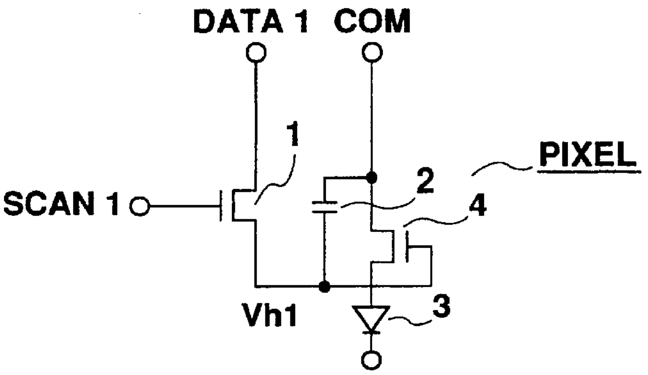
Fig. 1 RELATED ART
FIG. 1 is a circuit diagram showing an example of an EL display apparatus.
Figure 2:
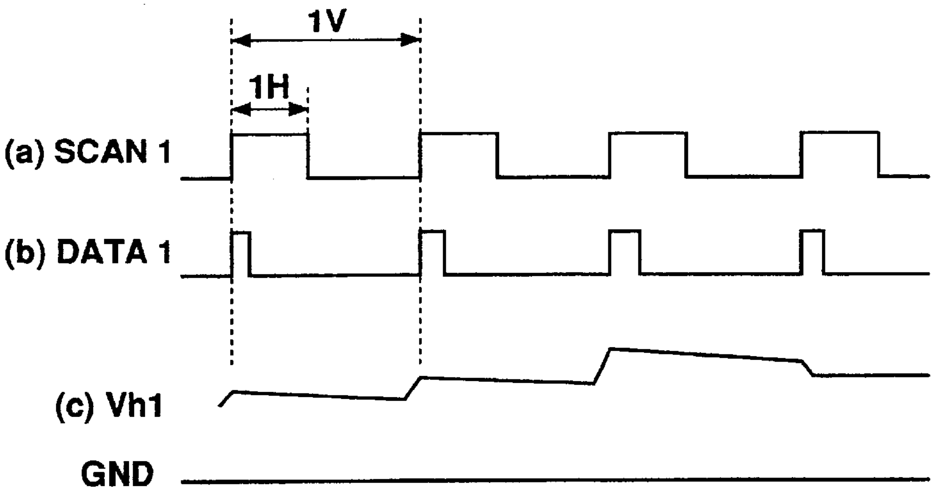
FIG. 2 is a timing chart illustrating the operation of the EL display apparatus.
Figure 3:
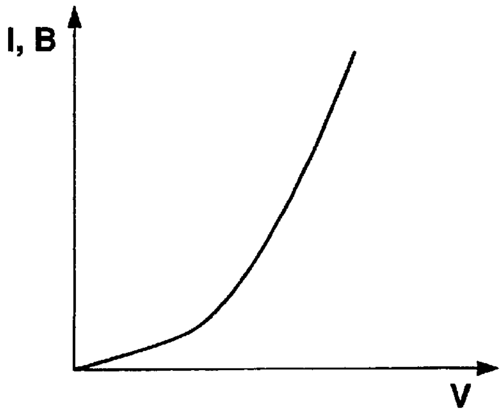
FIG. 3 is a characteristic diagram showing current or brightness versus voltage characteristic of the EL display apparatus.
Figure 4:
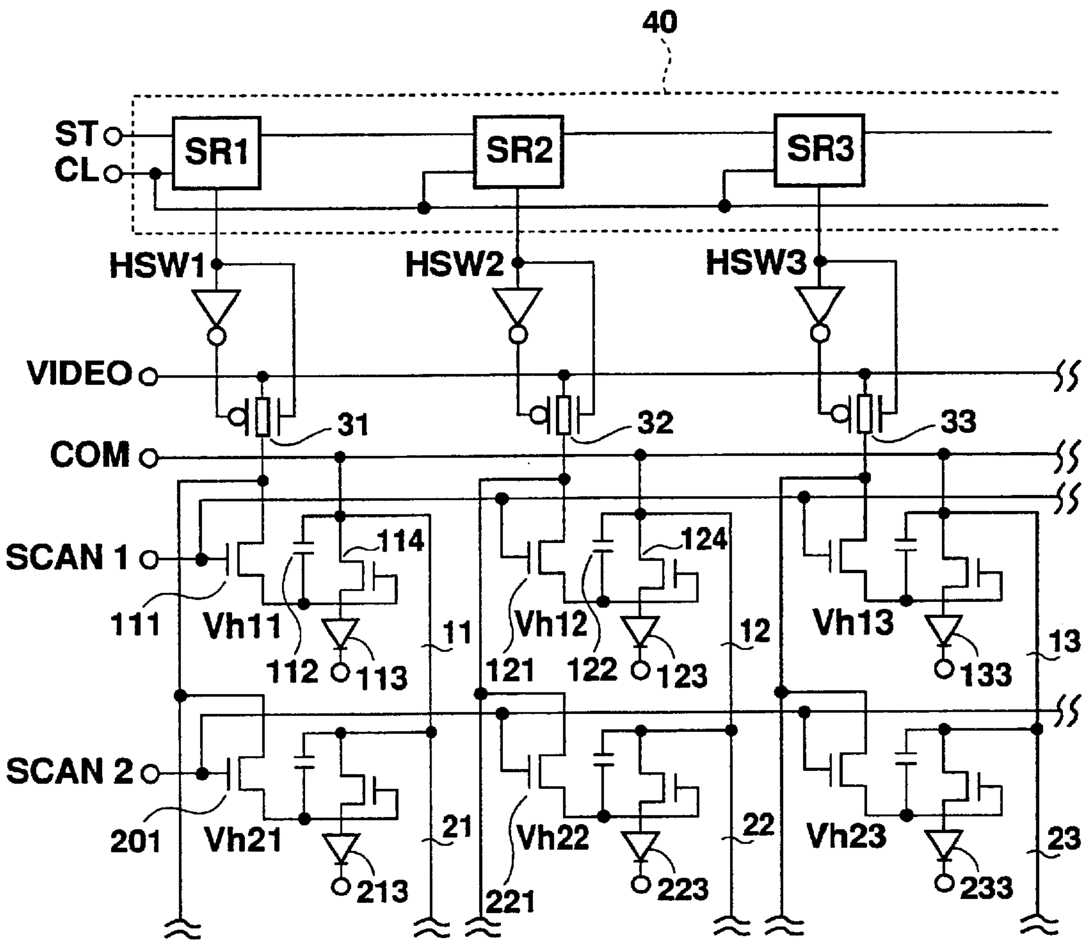
FIG. 4 is a circuit diagram showing an embodiment of the present invention.

FIG. 4 is a circuit diagram showing an embodiment of the present invention. A drive circuit for one pixel 11 comprises a first TFT 111 for switching, which has the selection signal SCAN1 applied to its gate and which turns on and off by the selection signal SCAN1, a capacitor 112, which is connected between the source of the TFT 111 and the driving supply COM, is charged by the display signal that is supplied when the TFT 111 is on, and holds a charging voltage Vh11 when the TFT 111 is off, and a second TFT 114, which has its drain connected to the driving supply COM and its source connected to the anode of an organic EL device 113, and its gate supplied with the holding voltage Vh11 from the capacitor 112 for driving the organic EL device 113. The TFT 111 and the TFT 114 are bottom gate structure type and n-channel TFTs and the voltage $V_{COM}$ of the driving supply COM is a positive voltage, such as 10 V. It should be noted that the capacitor 112 may be provided between the source of the TFT 111 and ground (GND), that a p-channel TFT may be used for the TFT 114, and that the top gate structure type may employ for TFTs 111 and 114.

Figure 5:
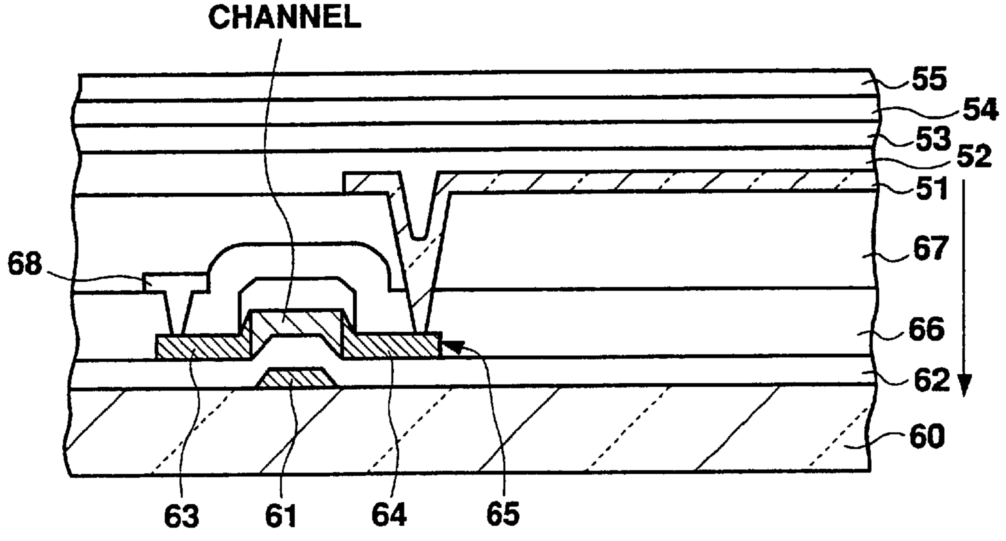
FIG. 5 is a sectional view showing the structure of the EL device and TFT in the present embodiment.

As shown in FIG. 5, the organic EL device 113 is formed from layers in sequence, between an anode 51 formed from a transparent electrode, such as indium tin oxide (ITO), and a cathode 55 formed from a magnesium-indium (MgIn) alloy, of a hole-transport layer 52 formed from 4,4'-bis(3-methylphenylphenylamino)biphenyl (MTDATA), an emissive layer 53 formed from 4,4', 4"-tris(3-methylphenylphenylamino)triphenylanine (TPD) and Rubrene, and an electron-transport layer 54 formed from $Alq_3$. The holes injected from the anode 51 and the electrons injected from the cathode 55 recombine within the emissive layer 53. As a result, the light emitting molecules are excited and again return to the ground state to release light, which is radiated outward from the transparent anode side in the direction of the arrow shown in the figure.

As shown on FIG. 5, the TFT 114 for EL drive is formed in sequence, on a glass substrate 60, from a gate electrode 61, a gate dielectric film 62, a polysilicon thin film 65 having a drain region 63 and a source region 64 and channel region therebetween, an interlayer insulating film 66, and a planarization film 67. The drain region 63 is connected to a drain electrode 68, and the source region 64 is connected to the transparent electrode 51, which is the anode of the organic EL device 113.

The other pixels 12, 13, and so forth, and pixels 21, 22, 23, and so forth, respectively have a structure identical to that of the one pixel 11 described above.

The EL display apparatus shown in FIG. 4 inputs an analog video signal VIDEO, and analog switches 31, 32, 33, and so forth, are provided for sampling the signal VIDEO at every column of the matrix. Each of the analog switches 31, 32, 33, and so forth, performs sampling according to sampling pulses HSW1, HSW2, HSW3, and so forth, that are output in sequence from a shift register 40, and the sampling signals are supplied to the individual pixels of the corresponding columns (display signal line). Within in each pixel, the sampling signal is supplied as the display signal to the drain of the first TFT. For example, within the pixels 11, 21, and so forth, arranged along the same column, the sampling signal from the analog switch 31 is supplied to the drain of the first TFT 111 and a first TFT 211. For the pixels 12, 22, and so forth, of another column, the sampling signal from the corresponding analog switch 32 is supplied to the drain of a first TFT 121 and a first TFT 221 within each respective pixel.

On the other hand, a different selection signal is supplied to each row, for example, the selection signal SCAN1 is supplied to the pixels 11, 12, 13, and so forth, arranged along the first row (first selection signal line), and a selection signal SCAN2 is supplied to the pixels 21, 22, 23, and so forth, of the second row. Within each pixel, the selection signal is applied to the gate of the first: TFT.

The operation of the present embodiment will be described next with reference to FIG. 6.

Figure 6:
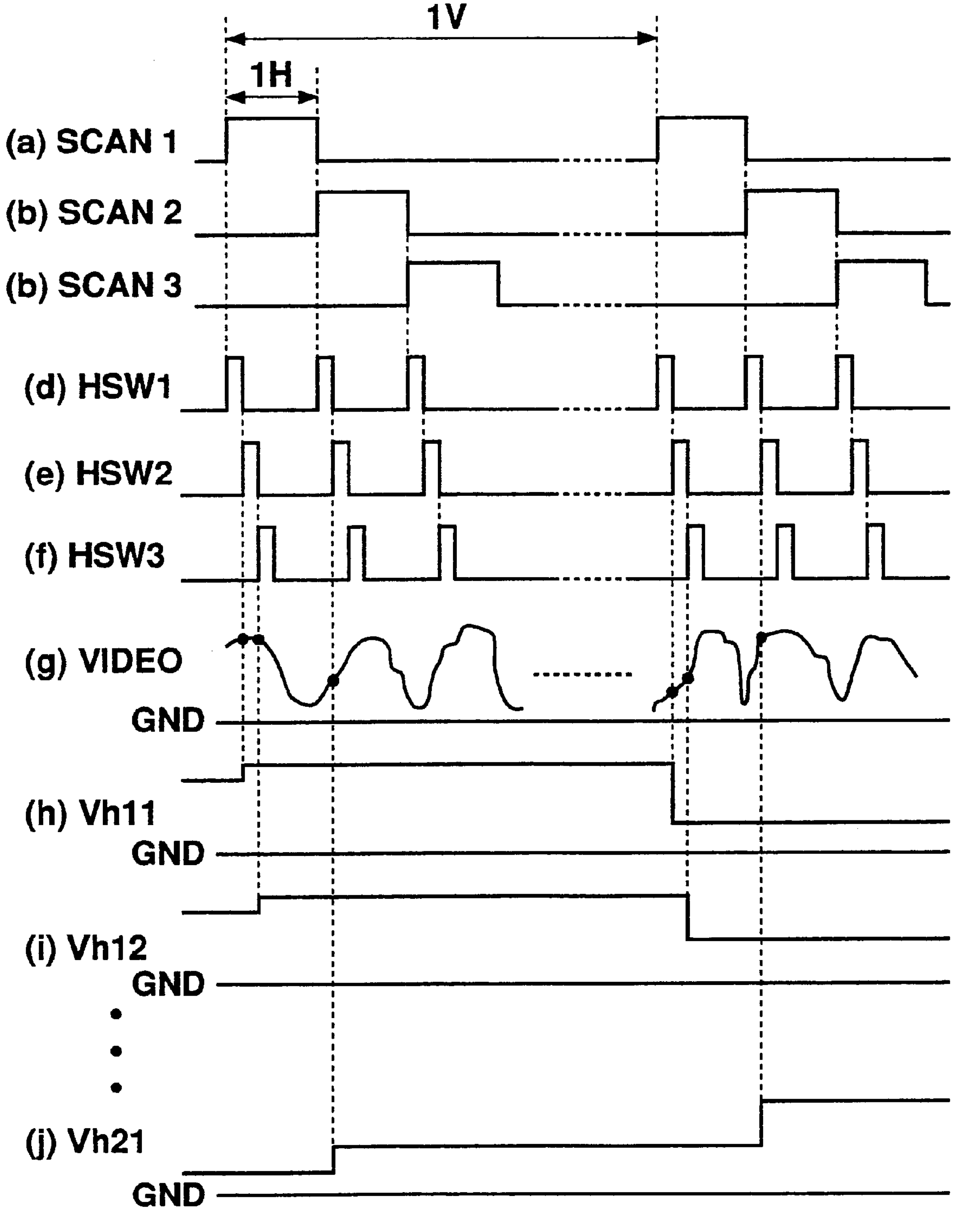
FIG. 6 is a timing chart illustrating the operation of the present embodiment.

First, as shown in FIGS. 6(*a*), (*b*), and (*c*), selection signals SCAN1, SCAN2, SCAN3, and so forth, sequentially become a high level during one vertical scan period (V), with the high level held for one horizontal scan period (H). The sampling pulses HSW1, HSW2, HSW3, and so forth, sequentially become a high level during each horizontal scan period as shown in FIGS. 6(*d*), (*e*), and (*f*), with the pulse width and pulse amplitude being constant.

When the selection signal SCAN1 becomes a high level, after which the sampling pulse HSW1 becomes a high level, the analog switch 31 turns on, and the analog video (image) signal VIDEO (FIG. 6(*g*)) that is input at the time is sampled. At this time, since the first TFT 111 at the pixel 11 is on, the sampled analog video signal voltage is supplied to one end of the capacitor 112 via the TFT 111, and the capacitor 112 is charged during the period where the HSW1 is at a high level. Since the TFT 111 is off during the period where HSW1 and SCAN1 are at a low level, the charged sampling voltage Vh11 shown in FIG. 6(*h*) is held during one vertical scan period at the capacitor 112.

The sampling voltage Vh11 is supplied to the gate of the driver TFT 114 so that the EL device 113 emits light at a luminance proportional to the sampling voltage Vh11, and this luminance is maintained until SCAN1 and HSW1 both reach a high level. When HSW2 becomes a high level after HSW1, the analog video signal VIDEO that is input at the time at the analog switch 32 is sampled, and a voltage level vh12 shown in FIG. 6(*i*) is held at a capacitor 122 via the TFT 121 within the pixel 12. An EL device 123 then emits light at a luminance proportional to the held voltage level Vh12. In the same manner, an EL device 133, and so forth, in the same column emit light in sequence. Thereafter, the selection signal SCAN1 becomes a low level, and when the SCAN2 instead becomes a high level, the analog image signal is similarly sampled at the analog switches 31, 32, 33 according to the sampling pulses HSW1, HSW2, and HSW3. However, since SCAN2 is at a high level, the sampling voltage is held in each capacitor within the pixels 21, 22, and 23 of the second row. Individual EL devices 213, 223, and 233 then emit light at a respective luminance according to held voltages Vh21, Vh22, and Vh23.

In this manner, the analog image signal voltage itself is held in the capacitor at each pixel, and the emitted luminance of the EL device is controlled according to this voltage, thus enabling the emitted luminance to be finely adjusted in an analog manner. Of course, the emitted luminance is adjusted by the analog voltage itself and is adaptable even though the image signal is $\gamma$ corrected, thus, enabling a multiple gray-scale display to be realized.

The sampling circuit samples the analog image signal in this manner as analog voltage data, and the sampled analog voltage data is held in the capacitor to drive the electroluminescence device.

Therefore, in the embodiment relating to the present invention, a gray-scale analog control becomes possible, and it becomes possible to accurately and easily perform a multiple gray-scale display in the active-matrix electroluminescence display apparatus.

Furthermore, as described above, it is possible to employ polycrystalline silicon in the active layer of the first and second thin-film transistors in the embodiment. However, it is of course possible to also employ amorphous silicon in the active layer. Thin-film transistors employing polycrystalline silicon for the active layer are capable of high-speed response, and the channel region, source region, and drain region of the transistors can be formed through self aligning so that the transistors can be formed in a small area. Therefore, by driving the electroluminescence device employing this sort of polycrystalline silicon thin-film transistor, it becomes easy to realize a high resolution display apparatus.

Furthermore, the organic electroluminescence device using an organic compound for the emissive layer as in the embodiment has a high degree of freedom in the color of emitted light and can realize a high emitted luminance. Therefore, using this sort of organic EL device in the display apparatus can yield a display apparatus having extremely superior luminescent characteristics.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. An electroluminescence display apparatus for performing display operations by driving an electroluminescence device having an emissive layer between a pair of electrodes, the electroluminescence display apparatus comprising:

- a sampling circuit for sampling an analog video signal at a predetermined period, the sampling circuit is an analog switch having a p-channel transistor and an n-channel transistor;
- a capacitor for holding a sampling voltage proportional to the sampled analog video signal that is output from said sampling circuit;
- a first switch for switching, which is disposed between said sampling circuit and said capacitor and which turns on and off according to a selection signal, for supplying the sampling voltage from said sampling circuit to said capacitor; and
- a second switch for device driving, which is connected to said electroluminescence device, for the purpose of controlling the light emission at the device by supplying current to said electroluminescence device according to said sampling voltage held at said capacitor, wherein a positive voltage is applied to one end of said second switch and said capacitor.

2. The electroluminescence display apparatus according to claim 1 wherein the sampling voltage that is sampled at said sampling circuit is a voltage proportional to a gray scale to be displayed.

3. The electroluminescence display apparatus according to claim 1 wherein said first and second switches are thin-film transistors which have their active layer formed from polycrystalline silicon.

4. The electroluminescence display apparatus according to claim 1 wherein said emissive layer of said electroluminescence device includes an organic compound with light emitting function.

5. An electroluminescence display apparatus for performing display operations by driving an electroluminescence device having an emissive layer between a pair of electrodes, the electroluminescence display apparatus comprising:

- a plurality of display signal lines along rows or columns, and a plurality of selection signal lines disposed so as to intersect with said display signal lines;
- a sampling circuit for sampling an analog video signal that is input and supplying an analog sampling voltage as a display signal to the corresponding line of said plurality of display signal lines, the sampling circuit is an analog switch having a p-channel transistor and an n-channel transistor; and
- a pixel formed near each intersection of said plurality of display signal lines and said plurality of selection signal lines;

said pixel comprising:

- the electroluminescence device for emitting light according to current supplied from a driving supply;
- a capacitor for holding the analog sampling voltage that is supplied as the display signal from said sampling circuit;
- a first thin-film transistor for switching, which is disposed between said sampling circuit and said capacitor and which turns on and off according to a selection signal that is received as a control signal, for supplying the sampling voltage from said sampling circuit to said capacitor; and a second thin-film transistor for device driving, which is connected to said electroluminescence device, for the purpose of causing the device to emit light by supplying current from said driving supply to said electroluminescence device according to said sampling voltage held at said capacitor, wherein a positive voltage is applied to one end of said second thin-film transistor and said capacitor.

6. The electroluminescence display apparatus according to claim 5 wherein the sampling voltage that is sampled at said sampling circuit is a voltage proportional to a gray scale to be displayed.

7. The electroluminescence display apparatus according to claim 5 wherein said first and second thin-film transistors have their active layer formed from polycrystalline silicon.

8. The electroluminescence display apparatus according to claim 5 wherein said emissive layer of said electroluminescence device includes an organic compound with light emitting function.

9. An electroluminescence display apparatus for performing display operations by driving an electroluminescence device having an emissive layer between a pair of electrodes, the electroluminescence display apparatus comprising:

a sampling circuit for sampling an analog video signal at a predetermined period, said sampling circuit having a complementary analog switch;

a capacitor for holding a sampling voltage proportional to the sampled analog video signal that is output from said sampling circuit;

a first switch for switching, which is disposed between said sampling circuit and said capacitor and which turns on and off according to a selection signal, for supplying the sampling voltage from said sampling circuit to said capacitor; and a second switch for device driving, which is connected to said electroluminescence device, for the purpose of controlling the light emission at the device by supplying current to said electroluminescence device according to said sampling voltage held at said capacitor.

10. An electroluminescence display apparatus for performing display operations by driving an electroluminescence device having an emissive layer between a pair of electrodes, the electroluminescence display apparatus comprising:

a plurality of display signal lines along rows or columns, and a plurality of selection signal lines disposed so as to intersect with said display signal lines;

a sampling circuit for sampling an analog video signal that is input and supplying an analog sampling voltage as a display signal to the corresponding line of said plurality of display signal lines, said sampling circuit having a complementary analog switch; and a pixel formed near each intersection of said plurality of display signal lines and said plurality of selection signal lines;

said pixel comprising:

the electroluminescence device for emitting light according to current supplied from a driving supply;

a capacitor for holding the analog sampling voltage that is supplied as the display signal from said sampling circuit;

a first thin-film transistor for switching, which is disposed between said sampling circuit and said capacitor and which turns on and off according to a selection signal that is received as a control signal, for supplying the sampling voltage from said sampling circuit to said capacitor; and a second thin-film transistor for device driving, which is connected to said electroluminescence device, for the purpose of causing the device to emit light by supplying current from said driving supply to said electroluminescence device according to said sampling voltage held at said capacitor.

11. The electroluminescence display apparatus according to claim 1, wherein said second switch is a p-channel.

12. The electroluminescence display apparatus according to claim 5, wherein said second thin film transistor is a p-channel.

* * * * *